United States Patent
Hou et al.

(10) Patent No.: US 11,736,100 B2
(45) Date of Patent: Aug. 22, 2023

(54) ACTIVE GATE VOLTAGE CONTROL CIRCUIT FOR BURST MODE AND PROTECTION MODE OPERATION OF POWER SWITCHING TRANSISTORS

(71) Applicant: GaN Systems Inc., Ottawa (CA)

(72) Inventors: Ruoyu Hou, Kanata (CA); Juncheng Lu, Kanata (CA); Larry Spaziani, Chelmsford, MA (US)

(73) Assignee: GAN SYSTEMS INC., Ottawa (CA)

( * ) Notice: Subject to any disclaimer, the term of this patent is extended or adjusted under 35 U.S.C. 154(b) by 274 days.

(21) Appl. No.: 17/308,423

(22) Filed: May 5, 2021

(65) Prior Publication Data
US 2022/0360259 A1  Nov. 10, 2022

(51) Int. Cl.
*H03K 17/0812* (2006.01)
*H03K 17/16* (2006.01)

(52) U.S. Cl.
CPC ..... *H03K 17/08122* (2013.01); *H03K 17/163* (2013.01)

(58) Field of Classification Search
CPC ............... H03K 17/08122; H03K 17/163
USPC ...................................................... 361/93.1
See application file for complete search history.

(56) References Cited

U.S. PATENT DOCUMENTS

| | | | | |
|---|---|---|---|---|
| 5,621,601 A | * | 4/1997 | Fujihira | H03K 17/0828 361/115 |
| 7,173,801 B2 | * | 2/2007 | Belverde | H03K 17/08128 361/93.1 |
| 8,803,508 B2 | | 8/2014 | Nakatake | |

(Continued)

FOREIGN PATENT DOCUMENTS

JP   2004289437 A   * 10/2004

OTHER PUBLICATIONS

Machine translation of Suhara Japanese Patent Document JP 2004-289437 A Oct. 14, 2004 (Year: 2004).*

*Primary Examiner* — Kevin J Comber
(74) *Attorney, Agent, or Firm* — Workman Nydegger

(57) ABSTRACT

An active gate voltage control circuit for a gate driver of a power semiconductor switching device comprising a power semiconductor transistor, such as a GaN HEMT, provides active gate voltage control comprising current burst mode operation and protection mode operation. The gate-source turn-on voltage $V_{gs(on)}$ is increased in burst mode operation, to allow for a temporary increase of saturation current. In protection mode operation, a multi-stage turn-off may be implemented, comprising reducing $V_{gs(on)}$ to implement fast soft turn-off, followed by full turn-off to bring $V_{gs(on)}$ below threshold voltage, to reduce switching transients such as $V_{ds}$ spikes. Circuits of example embodiments provide for burst mode operation for enhanced saturation current, to increase robustness of enhancement mode GaN power switching devices, e.g. under overcurrent and short circuit conditions, or to provide active gate voltage control which adjusts dynamically to specific operating conditions or events.

23 Claims, 8 Drawing Sheets

(56) References Cited

U.S. PATENT DOCUMENTS

2019/0140630 A1\* 5/2019 Chen .................... H03K 17/163
2020/0195245 A1\* 6/2020 Randolph ............ H03K 17/163

\* cited by examiner

Without burst mode

With burst mode

ACTIVE GATE VOLTAGE CONTROL CIRCUIT FOR BURST MODE AND PROTECTION MODE OPERATION OF POWER SWITCHING TRANSISTORS

CROSS-REFERENCE TO RELATED APPLICATION(S)

This application is related to U.S. patent application Ser. No. 15/807,021 filed Nov. 8, 2017, entitled "GaN Transistor with Integrated Drain Voltage Sense for Fast Overcurrent and Short Circuit Protection", which is incorporated herein by reference in its entirety.

TECHNICAL FIELD

This invention relates to a power semiconductor switching devices, and particularly to power semiconductor switching devices comprising wide bandgap power transistors such as GaN power transistors, e.g. GaN HEMTs (High Electron Mobility Transistors).

BACKGROUND

Fast wide bandgap semiconductor power devices, such as Gallium Nitride (GaN) and Silicon Carbide (SiC) transistors require fast short circuit and overcurrent protection. For example, some methods for overcurrent protection are summarized in the background section of above-referenced U.S. patent application Ser. No. 15/807,021 entitled "GaN Transistor with Integrated Drain Voltage Sense for Fast Overcurrent and Short Circuit Protection", and references cited therein, e.g. U.S. Pat. No. 5,621,601 issued Apr. 15, 1997 entitled "Over-current protection apparatus for transistor", and U.S. Pat. No. 8,803,508 issued Aug. 14, 2014 entitled "Semiconductor Device and Error Detector".

U.S. patent application Ser. No. 15/807,021 discloses a GaN transistor switch having an integrated drain voltage sense for generating a drain voltage sense output, and fault detection circuitry generates a fault signal when the drain voltage sense output reaches or exceeds a reference value, which triggers fast turn-off of the gate of the GaN transistor switch. Optionally a two-stage turn-off is provided, in which fast soft turn off circuitry is triggered first by the fault signal, followed by a delay before full turn-off of the gate of the GaN transistor switch.

It is recognized that the saturation current of enhancement-mode (e-mode) GaN HEMTs is much lower than other types of power semiconductor transistors such as normally-on GaN HEMTs, SiC MOSFETs, Si MOSFETs and Si IGBTs.

Device failure may occur if there is an inrush current, e.g. during a surge test, load transition, grid transition, etc., or during a short circuit condition.

There is a need for improved or alternative solutions for improving robustness of power switching devices comprising power semiconductor transistors, including GaN power transistors such as, e-mode GaN HEMTs.

SUMMARY OF INVENTION

The present invention seeks to provide improved or alternative solutions to mitigate at least one of issues relating to saturation current and/or short circuit and overcurrent protection for power semiconductor switching devices.

Aspects of the invention provide semiconductor device structures and circuits for active gate voltage control for burst mode operation of power semiconductor switching devices, which provides for an enhanced saturation current, and protection mode operation which provides short circuit and overcurrent protection.

One aspect of the invention provides provides an active gate voltage control circuit for a power semiconductor transistor comprising: a sensing circuit for monitoring an on-state operational parameter of the power semiconductor transistor and generating a sense output signal indicative of the on-state operational parameter; and first logic circuitry configured to compare the sense output signal with a first reference signal Sense$_{ref1}$ and generating a first control signal to implement burst mode operation when the sense output signal is ≥Sense$_{ref1}$, wherein: burst mode operation comprises outputting the first control signal to a gate driver of the power semiconductor transistor to increase a gate-source voltage to enable an increased saturation current when the sense output signal is ≥Sense$_{ref1}$.

The active gate voltage control circuit may comprise second logic circuitry configured to compare the sense output signal with a second reference signal Sense$_{ref2}$ and generate a second control signal for implementing protection mode when the sense output signal is ≥Sense$_{ref2}$ wherein: protection mode operation comprises outputting the second control signal to the gate driver to reduce the gate-source voltage when the sense output signal is ≥Sense$_{ref2}$. Protection mode may comprise implementation of at least one of single-stage turn-off and multi-stage turn-off of the power semiconductor transistor.

For example, Sense$_{ref1}$ and Sense$_{ref2}$ are selected to maintain a turn-on gate-source voltage ($V_{gs(on)}$) in a range that enables a temporarily increased saturation current, e.g. for dynamic performance management, but does not significantly contribute to early device failure or affect long term reliability.

The second logic circuitry may be configured to implement multi-stage turn-off, by reducing the gate-source voltage of the power transistor to implement fast soft turn-off, followed by a delay before reducing the gate-source voltage to below a gate-source threshold voltage for full turn-off of the gate of the power semiconductor transistor.

For example, operation of a power semiconductor switching device comprising an E-mode GaN HEMT, wherein the sensing circuit comprises a drain-source voltage sensing circuit for sensing a drain-source on-voltage $V_{ds(on)}$, and the gate driver is configured to provide a first gate-source turn-on voltage $V_{gs(on)}$, (e.g. 6V), for normal operation and a gate-source turn-off voltage $V_{gs(off)}$ of 0V or a negative bias, wherein:

when the drain-source voltage $V_{ds(on)}$ reaches or exceeds a first voltage reference $V_{ref1}$, the gate turn-on voltage is increased to a second gate turn-on voltage $V_{gs(on\text{-}boost)}$, which is several volts greater than the first gate turn-on voltage, (e.g. 8V), to the implement burst mode operation; and when the drain source voltage $V_{ds(on)}$ reaches or exceeds a second voltage reference $V_{ref2}$, the gate-source turn-on voltage is first reduced to several volts below the first gate turn-on voltage $V_{gs(on)}$, (e.g. 4V) to implement soft turn-off, and then reduced to the gate-source turn-off voltage, to fully turn-off the gate of the power semiconductor transistor.

For example, $V_{ref1}$ and $V_{ref2}$ are selected to maintain $V_{gs(on)}$ in a range, e.g. <10V, that does not significantly affect long term reliability. For example, the first reference voltage $V_{ref1}$ is e.g. 4V and the second reference voltage $V_{ref2}$ is e.g. 8V.

Another aspect of the invention provides an active gate voltage control circuit for a power semiconductor transistor comprising:

a gate driver having power supply inputs $V_{DD}$ and $V_{EE}$, an input for receiving a gate drive control signal and an output for outputting a gate-source turn-on voltage ($V_{gs(on)}$) and a gate drive turn-off voltage ($V_{gs(off)}$), a detection circuit for monitoring a drain-source on-voltage $V_{ds(on)}$ of the power semiconductor transistor and generating an output voltage signal $V_{measure}$ indicative of $V_{ds(on)}$;

a first reference voltage input providing a first reference voltage $V_{ref1}$ for implementing burst mode operation;

a second reference voltage input providing a second reference voltage $V_{ref2}$ for implementing protection mode operation, where $V_{ref2}$ is greater than $V_{ref1}$;

first logic circuitry configured to compare the output signal voltage $V_{measure}$ with the first reference voltage $V_{ref1}$ and generate a first (burst mode) control signal when $V_{measure}$ is $\geq V_{ref1}$, the first control signal being output to the gate driver to implement burst mode operation comprising increasing the turn-on gate voltage when $V_{measure}$ is $\geq V_{ref1}$;

second logic circuitry configured to compare the output signal voltage $V_{measure}$ with the second reference voltage $V_{ref2}$ and generate a second (protection mode) control signal when $V_{measure}$ is $\geq V_{ref2}$; the second control signal being output to the gate driver to implement protection mode operation comprising reducing the turn-on gate-so voltage when $V_{measure}$ is $\geq V_{ref2}$ and implementing at least one of single-stage turn-off and multi-stage turn-off of the power semiconductor transistor.

For example, the second logic circuitry is configured to implement multi-stage turn-off, by reducing the gate-source voltage Vgs(on) of the power transistor to a soft turn-off voltage Vgs(soft turn-off) for soft turn-off, followed by a delay before reducing the gate-source voltage to below a threshold voltage for full turn-off of the gate of the power semiconductor transistor.

In some embodiments, the drain voltage sensing circuit is integrated with the power semiconductor transistor and the first and second logic circuits are integrated with the gate driver.

In an example embodiment, for operation of a power semiconductor switching device comprising an E-mode GaN HEMT, configured to provide a turn-on gate-source voltage Vgs(on) of 6V for normal operation and a turn-off gate-source voltage Vgs(off) of 0V or a negative bias, wherein when the drain-source voltage Vds reaches or exceeds Vref1, the gate-source turn-on voltage is increased to 8V to implement burst mode and allow for a higher saturation current, and when the drain source voltage Vds reaches or exceeds Vref2, the gate turn-on voltage is reduced to 4V, to implement soft turn-off, and then reduced to 0V, or below, to fully turn-off the gate of the power semiconductor transistor.

For example, the first reference voltage Vref1 is 4V and the second reference voltage Vref2 is 8V.

In an example embodiment, the gate driver provides bipolar driving and a voltage divider arrangement of first and second Zener diodes with active control of a transistor in series with the first Zener diode for providing a first turn-on gate-source voltage Vgs(on) for normal operation and the second Zener diode providing a second turn-on gate-source voltage Vgs(boost) for burst mode operation.

In another example embodiment, the gate driver comprises an adjustable low drop out regulator (LDO) with unipolar driving and the first control signal provides active control on the LDO to adjust the turn-on gate-source voltage Vgs(on).

For example, for implementation of multi-stage turn-off, the gate driver comprises an active pull-down circuit connected directly to the gate output of the gate driver which receives the second control signal. For example, the active pull-down circuit comprises an actively controlled voltage divider to reduce Vgs(on) on receiving the second control signal. In an example embodiment, the gate driver comprises an actively controlled voltage divider connected close to the gate output of the gate driver for reducing the gate voltage to the soft turn-off value Vgs(soft turn-off) on receiving the second control signal, and wherein the second control signal is provided to the gate driver to turn-off the gate of the power semiconductor transistor after said delay.

In another aspect there is provided an active gate voltage control circuit for a power semiconductor transistor comprising:

a gate driver for outputting a turn-on gate-source voltage Vgs(on) and a turn-off gate-source voltage Vgs(off) in response to a gate drive control signal, drain voltage sensing means for sensing a drain-source on-voltage Vds(on) of the power semiconductor transistor and generating a voltage signal Vmeasure indicative of Vds(on);

a first logic means for comparing the output signal voltage Vmeasure with a first reference voltage Vref1 and generating a first (burst mode) control signal when Vmeasure is $\geq$Vref1, the first control signal being fed to the gate driver to implement burst mode operation comprising increasing the turn-on gate-source voltage when Vmeasure is $\geq$Vref1 to enable a higher saturation current;

a second logic means for comparing the output signal voltage Vmeasure with a second reference voltage Vref2 and generating a second (protection mode) control signal when Vmeasure is $\geq$Vref2; the second control signal being fed to the gate driver to reduce the gate-source voltage when Vmeasure is $\geq$Vref2 to implement protection mode operation, e.g. comprising one of single-stage turn-off and multi-stage turn-off of the power semiconductor transistor.

Multi-stage turn-off may comprise firstly reducing the gate-source voltage a few volts below the turn-on gate-source voltage for normal operation to implement soft turn-off, and then reducing the gate-source voltage below a threshold voltage to fully turn-off the power semiconductor transistor.

For example, the drain voltage sensing means may comprise any one of: a drain-source on-voltage sensing circuit integrated with the power semiconductor transistor; a drain-source on-voltage sensing circuit integrated with the gate driver; a drain-source on-voltage sensing circuit comprising discrete components; and other feasible combinations of integrated and discrete components.

The first and second logic means may comprise any one of: first and second logic circuits integrated with the power semiconductor transistor; first and second logic circuits integrated with the gate driver; first and second logic circuits integrated comprising discrete components; and other feasible combinations of integrated and discrete components.

For example, the drain voltage sensing means and the first and second logic means may comprise discrete components co-packaged with the gate driver and the power semiconductor transistor. For example, the drain voltage sensing means and the first and second circuit means may be integrated with the gate driver. For example, the drain voltage sensing means may be integrated with the power semiconductor transistor and the first and second circuit means are integrated with the gate driver.

In another aspect, there is provided method of actively controlling a gate-source voltage for turn-on and turn-off of a power semiconductor device, e.g. comprising a GaN power transistor, such as an e-mode GaN HEMT, the method comprising:

providing a gate-source voltage Vgs(on) to turn on the power transistor;

sensing a drain-source on-voltage Vds(on) of the power semiconductor transistor and generating a voltage signal Vmeasure indicative of Vds(on);

in a first logic circuit, comparing the output signal voltage Vmeasure with a first reference voltage Vref1 and generating a first (burst mode) control signal when Vmeasure is ≥Vref1, and providing the first control signal to a gate driver of the GaN power transistor to implement burst mode operation comprising increasing the turn-on gate-source voltage when Vmeasure is ≥Vref1 to enable a higher saturation current;

in a second logic circuit, comparing the output signal voltage Vmeasure with a second reference voltage Vref2 and generating a second (protection mode) control signal when Vmeasure is ≥Vref2; and providing the second control signal to the gate driver to reduce the gate-source voltage when Vmeasure is ≥Vref2 to implement protection mode operation. Protection mode operation may comprise one of single-stage turn-off and multi-stage turn-off of the power semiconductor transistor.

Thus devices and circuits are disclosed for active gate voltage control, which enables burst mode operation and protection mode operation of a power semiconductor switching device comprising a power semiconductor transistor, such as an e-mode GaN HEMT, e.g. to provide for at least one of enhanced saturation current, over-current protection and short circuit protection.

The foregoing and other features, aspects and advantages of the present invention will become more apparent from the following detailed description, taken in conjunction with the accompanying drawings, of some embodiments of the invention, which description is by way of example only.

DETAILED DESCRIPTION

Figure 1:
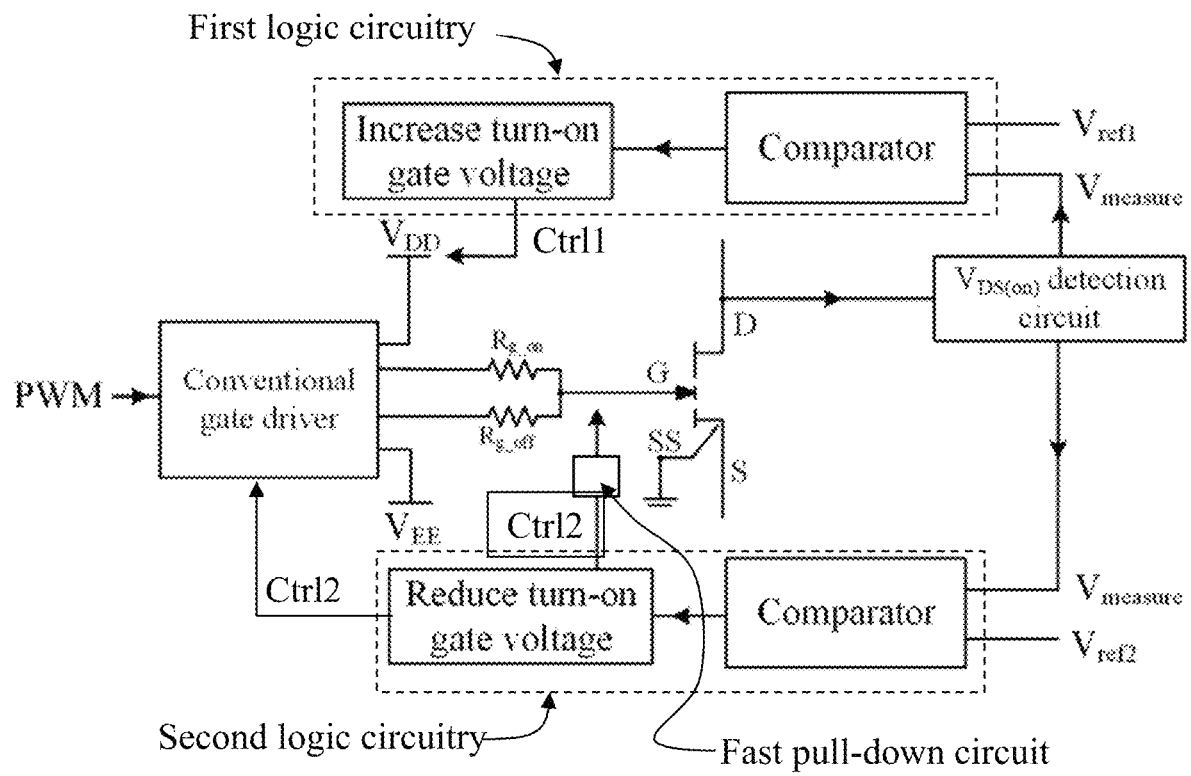
FIG. 1 shows a schematic circuit block diagram for implementation of active gate voltage control for a power switching device of an embodiment comprising a GaN HEMT.

A schematic circuit block diagram for implementation of active gate voltage control for a power switching device of an example embodiment is shown in FIG. 1. For example, the power switching device comprises an e-mode GaN HEMT comprising a source, a drain and a gate, and respective source, drain and gate terminals (S, D, G) and a source sense (Kelvin source) terminal (SS). The GaN HEMT may be driven by a conventional gate driver having power input terminals $V_{DD}$ and $V_{EE}$. The gate driver receives a gate drive control signal, i.e. PWM input signal, and outputs an appropriate gate voltage Vgs to turn-on and turn-off the transistor. For example, the power source may be a 0 to 9V power source and, for normal operation of an e-mode GaN HEMT, the gate driver is configured to output a +6V gate voltage $V_{gs(on)}$ to turn-on the transistor and to output a gate voltage $V_{gs(off)}$ below the threshold voltage, e.g. 0V or less, e.g. a negative bias of −3V, to turn-off the transistor. In this example, separate gate resistors $R_{g\text{-}on}$ and $R_{g\text{-}off}$ are provided to control turn-on and turn-off rates.

The active gate voltage control circuitry comprises a detection circuit for monitoring the drain-source on-voltage $V_{ds(on)}$ and generating an output signal $V_{measure}$ indicative of $V_{ds(on)}$. The detection circuit may be integrated with the GaN HEMT, e.g. a drain voltage sense circuit as disclosed in U.S. Ser. No. 15/807,021, or the detection circuit may comprise discrete components. The output signal $V_{measure}$ is fed to a first logic circuit, comprising a first comparator, and a second logic circuit, comprising a second comparator. A first voltage input to the first logic circuit provides a first reference voltage $V_{ref1}$ for burst mode operation. A second voltage input to the second logic circuit provides a second reference voltage $V_{ref2}$ for protection mode operation.

In the first logic circuit, the first comparator compares $V_{measure}$ and the first reference signal $V_{ref1}$, and a logic element, such as a latch, generates a first (burst mode) control signal Ctrl1 when $V_{measure}$ is ≥$V_{ref1}$. The burst mode control signal Ctrl1 is fed to the gate driver to initiate boost mode operation comprising boosting the turn-on gate voltage $V_{gs(on)}$ when $V_{measure}$ is ≥$V_{ref1}$. For example, gate driver operates to gradually increase the gate drive voltage $V_{gs(on)}$ from 6V used for normal operation to 8V for burst mode operation, over a specified time period, e.g. 5 μs, to allow for a higher saturation current.

In the second logic circuit, the second comparator compares $V_{measure}$ and the second reference signal $V_{ref2}$, and a logic element, such as a latch, generates a second (protection mode) control signal Ctrl2 when $V_{measure}$ is ≥$V_{ref2}$. The protection mode control signal Ctrl2 is fed to the gate driver to implement protection mode operation comprising reducing the gate voltage below the threshold voltage to turn-off the power switching device when $V_{measure}$ is $\geq V_{ref2}$. A multi-stage turn-off may be used to reduce the turn-on gate voltage, in two or more steps, comprising implementing fast soft turn-off, before full turn-off, of the GaN HEMT. For example, gate voltage control circuitry may comprise an active pull-down circuit comprising a resistor and a transistor, which receives the second control signal Ctrl2 from the second logic circuitry. The active pull-down circuit may be connected directly to, or close to, the gate terminal of the GaN HEMT, to implement fast soft switching to reduce the gate voltage $V_{gs}$, with minimal delay, e.g. on a nanosecond timescale. Then the second control voltage Ctrl2, which is output to the gate driver, further reduces the gate voltage $V_{gs}$ to below threshold voltage, to fully turn-off the GaN HEMT, e.g. after a delay of tens of nanoseconds.

Figure 2:
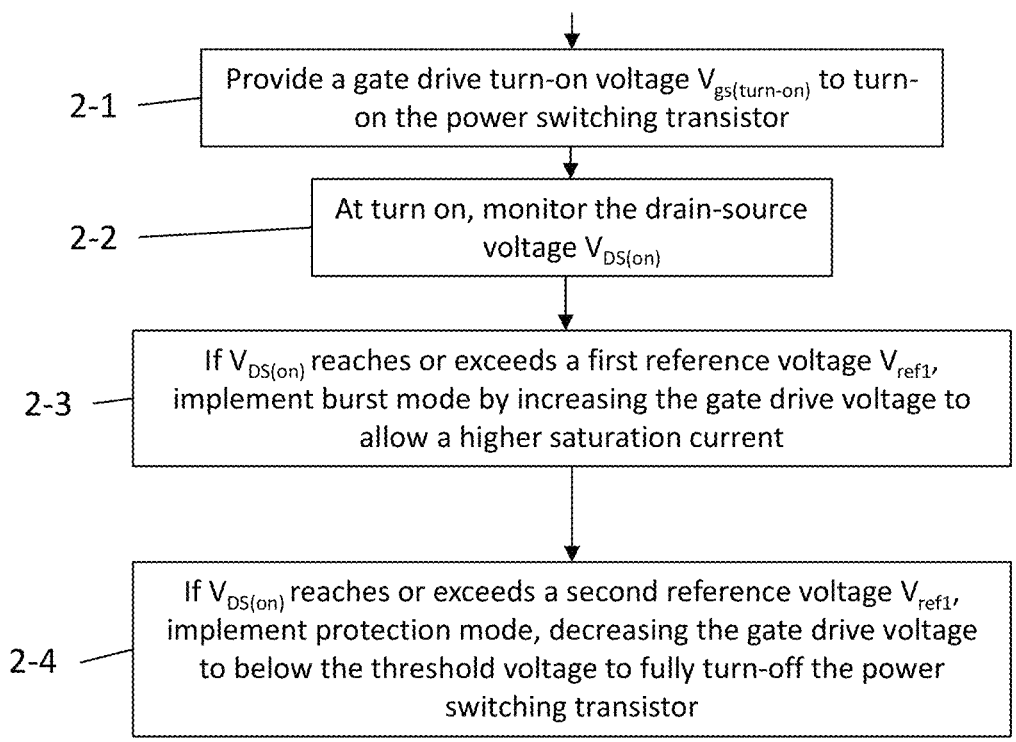
FIG. 2 shows a simplified flow chart for implementing a method of active gate voltage control for a power switching transistor, for burst mode operation and for protection mode operation with single-stage turn-off according to a first embodiment of the present invention.
Figure 3:
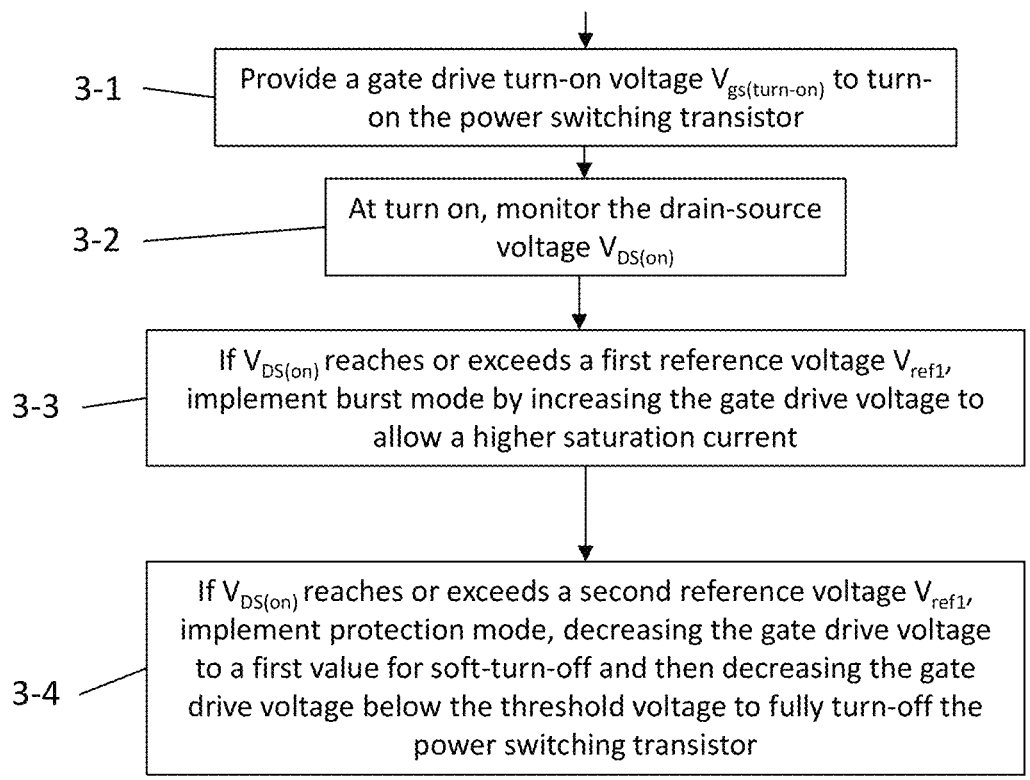
FIG. 3 shows a simplified flow chart for implementing a method of active gate voltage control for a power switching transistor, for burst mode operation and for protection mode operation with multi-stage turn-off according to a second embodiment of the present invention.

FIG. 2 shows a simplified flowchart to illustrate steps of the method of providing active gate voltage control with burst mode and protection mode with single stage turn-off. FIG. 3 shows a simplified flowchart to illustrate steps of the method of providing active gate voltage control with burst mode and protection mode with multi-stage turn-off.

Figure 4:
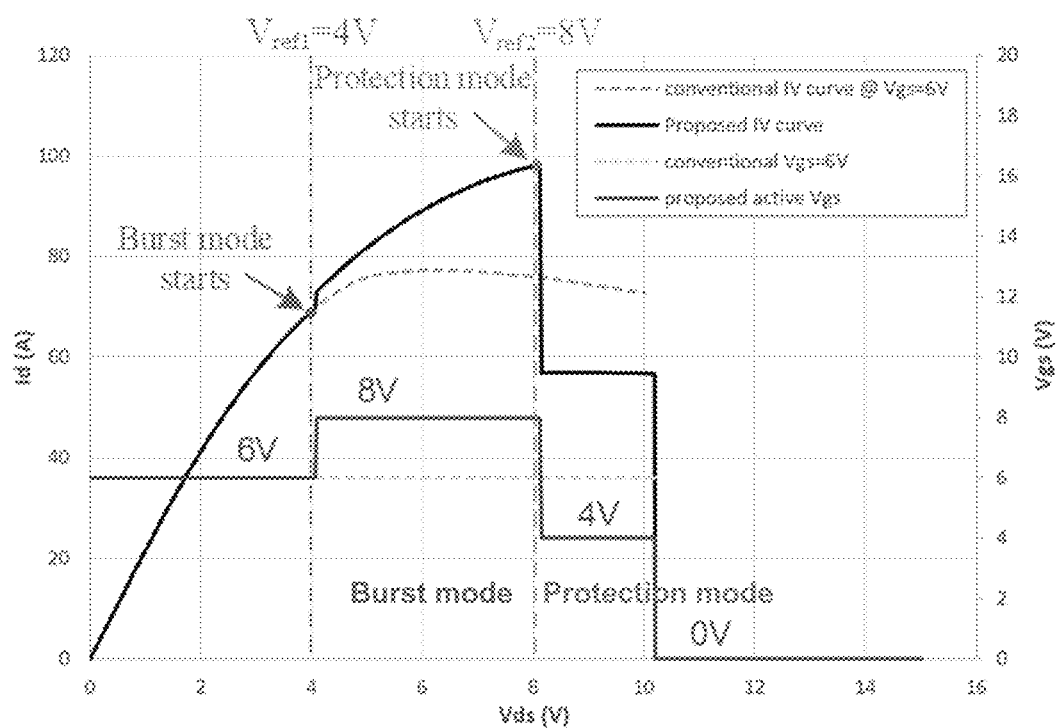
FIG. 4 shows a plot of drain current $I_d$ vs. drain-source voltage $V_{ds}$ for an example implementation of active gate voltage control for a GaN HEMT.
Figure 5:
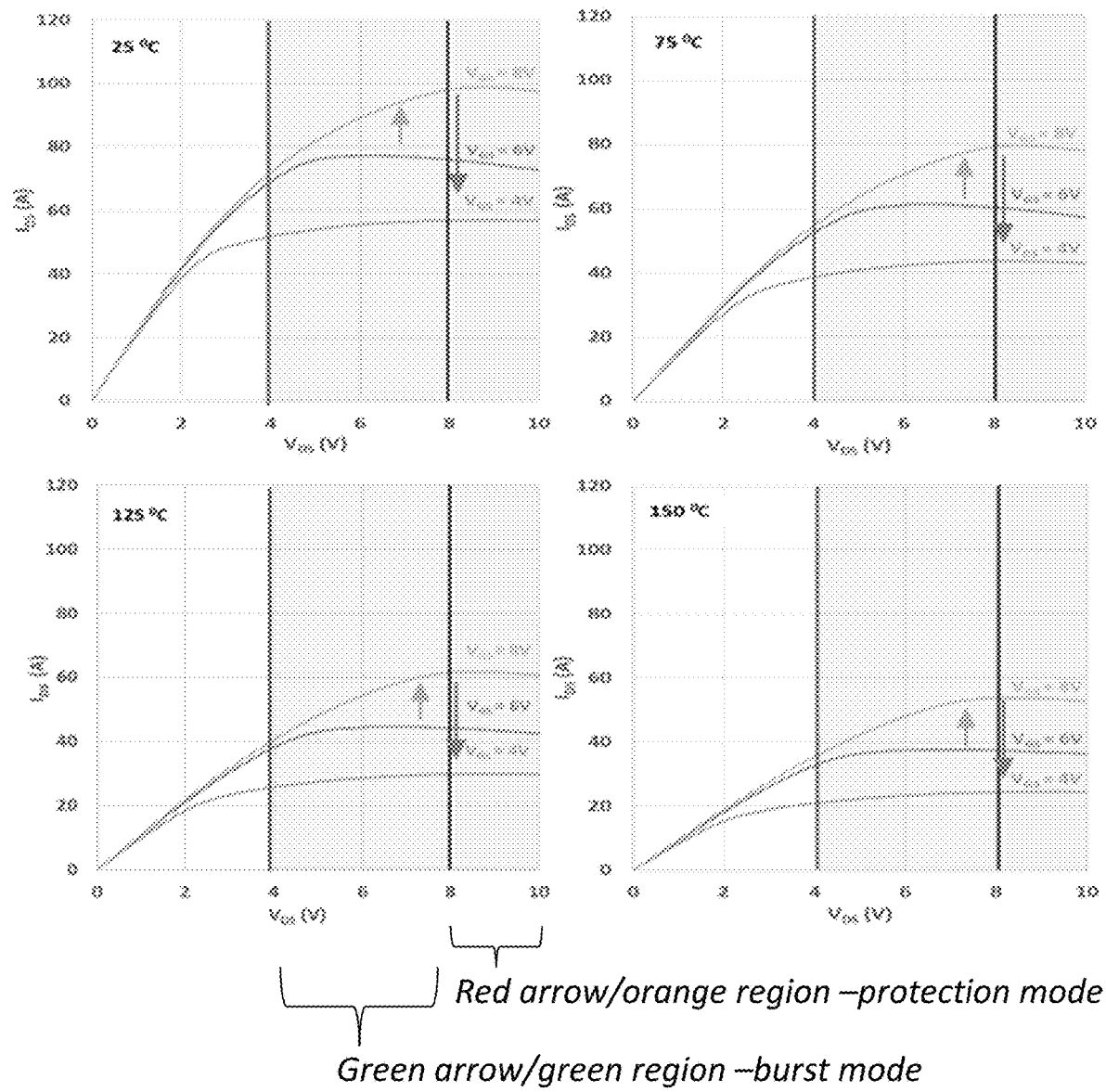
FIG. 5 shows measured I/V curves for some different example scenarios/conditions.

FIG. 4 shows a current-voltage (IV) plot of drain current $I_d$ vs. drain-source voltage $V_{ds}$ for an example implementation of active gate voltage control for an example GaN HEMT (GaN Systems Inc. GS66508B) which is rated for operation at 650V and 30 A, e.g. using a 0V to 6V gate drive voltage. This device is capable of a high switching frequency >10 MHz and has a transient tolerant gate drive in a range of −20V to +10V.

For example, during normal operation, a gate voltage $V_{gs(on)}$ of several volts in excess of the threshold voltage, e.g. 6V, is used to turn-on the transistor. To turn-off the transistor, the gate voltage $Vgs_{off}$ is reduced below the threshold voltage, e.g. to 0V, or a few volts negative, e.g. −3V. That is, in a simple gate drive circuit, the gate driver applies either $Vgs_{on}$ or $Vgs_{off}$ to the gate terminal of the GaN HEMT, to turn the device on and off. In this example, as indicated by the dashed lines, if gate voltage is held at $Vgs_{on}$=6V, in an overcurrent situation, the measured drain-source voltage drop $V_{ds(on)}$ will increase as the drain current increases and reaches saturation, e.g. as the IV curve levels off at a drain current around 75 A. Using an active gate voltage control circuit as illustrated schematically in FIG. 1, in burst mode operation, when $V_{ds(on)}$ reaches or exceeds the first reference value $V_{ref1}$, e.g. 4V, the first logic circuitry generates the first control signal which is fed to the gate driver to increase or boost the gate voltage $Vgs_{on}$ to a burst mode value, which is several volts higher, e.g. 8V. Boosting the gate voltage $Vgs_{on}$ enables the GaN HEMT to temporarily conduct a higher saturation current, e.g. in the event of a current surge due to a grid transition or load transition. To limit the current to a safe operating value, protection mode is implemented when $V_{ds(on)}$ reaches or exceeds the second reference value $V_{ref2}$, e.g. 8V, in which the second logic circuitry generates the second control signal Ctrl2 which is sent to the gate driver to turn-off the GaN HEMT. Beneficially, the active gate voltage control circuitry is configured to implement two stage turn-off, by first bringing the gate voltage $V_{gs-on}$ down a protection mode value, e.g. 4V, before full turn-off. Reducing the gate voltage to a few volts below the usual operational voltage of $V_{gs-on}$=6V provides soft turn-off, to reduce the drain current before the gate voltage is reduced to $V_{gs-off}$=0V or below, to fully turn-off the GaN HEMT.

Figure 6:
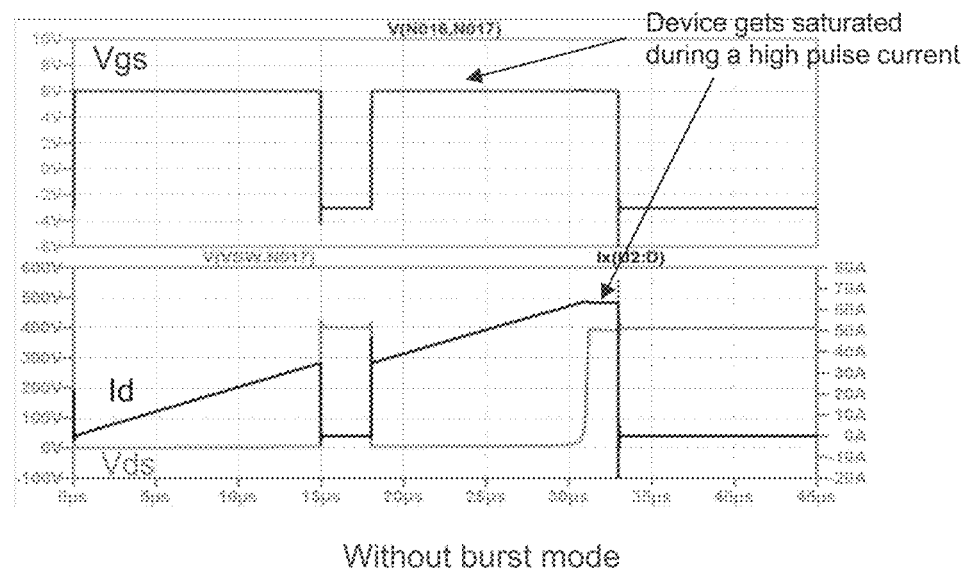
FIGS. 6 and 7 show some simulation results with and without burst mode operation.

FIG. 6 shows measured I/V curves for some different example scenarios/conditions for a junction temperature $T_j$ of 25 C, 75 C, 125 C and 150 C. $V_{DS(on)}$ is measured and compared with two reference voltages Vref1 and Vref2. The gate voltage $V_{gs}$ is actively controlled to implement burst mode operation and protection mode operation.

Figure 7:
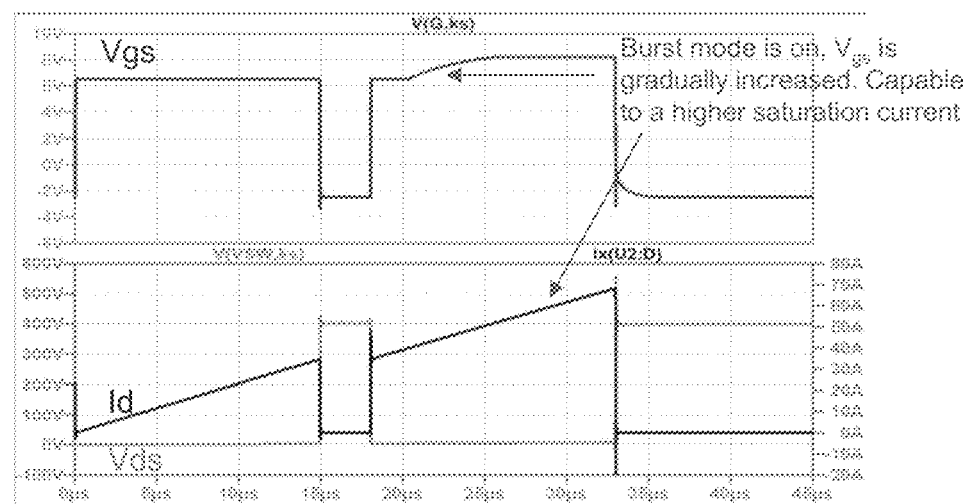
Figure 8:
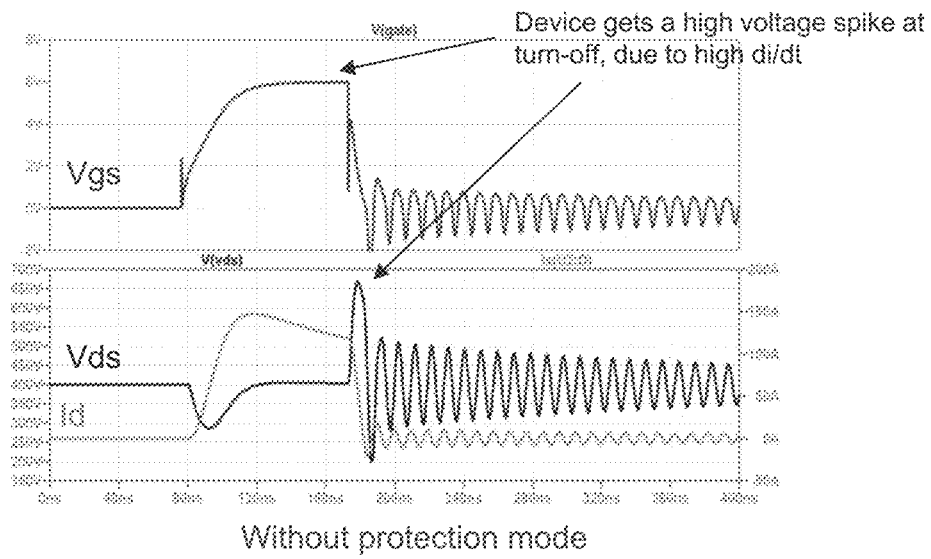
FIGS. 8 and 9 show some simulation results with and without protection mode operation.

FIG. 7 and FIG. 8 compare some example simulation results to illustrate the functionality of burst mode operation. FIG. 7 shows simulation results for operation with gate on/off voltages of $V_{gs(off)}$=−3V and $V_{gs-on}$=+6V to illustrate a normal current pulse of 30 A (without saturation) and how the device gets saturated at 60 A during a high current pulse.

FIG. 8 shows some simulation results for protection mode operation in which the $V_{gs-on}$ is increased gradually, e.g. over 5 µs, from +6V to +8V for burst mode operation when $V_{ds(on)}$ reaches/exceeds $V_{ref1}$, allowing a higher saturation current. For example, burst mode is on when $V_{ds(on)}$ is ≥4V. Adjusting $V_{gs}$ higher increases the saturation current and reduces the forward voltage drop. Extra saturation current capacity, e.g. 20 A for GS66508B, is gained to improve current pulse performance.

Figure 9:
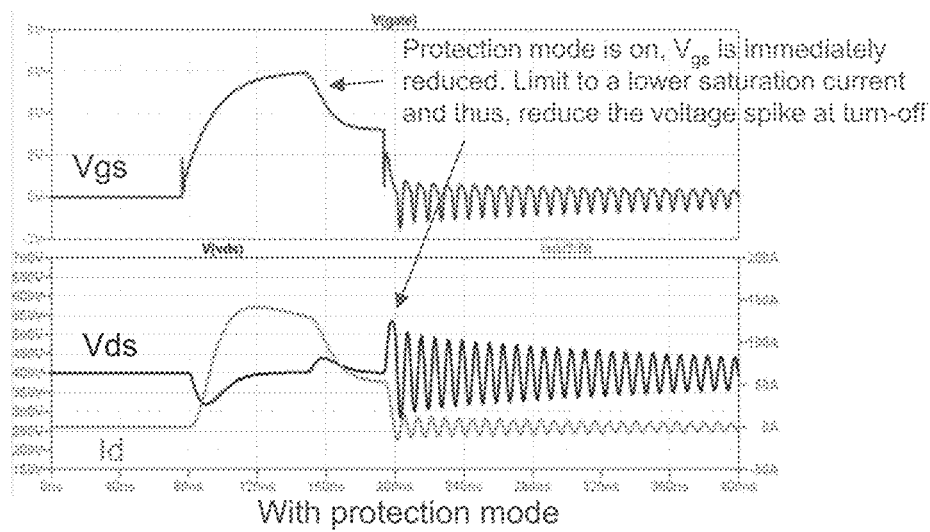

FIG. 8 and FIG. 9 compare some example simulation results to illustrate functionality of protection mode operation. FIG. 8 shows simulation results for an overcurrent scenario, in which, for normal operation, the turn-off gate voltage is $V_{gs-off}$=0V and the turn-on gate voltage $V_{gs-on}$=6V. Without protection mode, when the gate voltage is reduced from 6V to <0V over a 20 ns time frame, the device experiences a high voltage spike at turn-off due to very high di/dt. FIG. 9 shows some simulation results when protection mode is implemented. For example, protection mode is turned-on when $V_{ds(on)}$=8V. $V_{gs}$ is immediately reduced to 4V to implement fast soft turn-off on a nanosecond time scale, and then Vgs is reduced to 0V or below to shut down. The lower $I_{sat}$ reduces the $V_{ds}$ voltage spike at turn-off.

Figure 10:
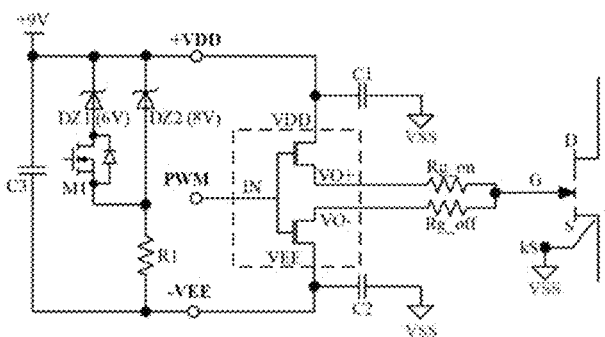
FIG. 10 shows a circuit schematic for an example implementation of burst mode operation with active control on a Zener diode with bipolar driving.
Figure 11:
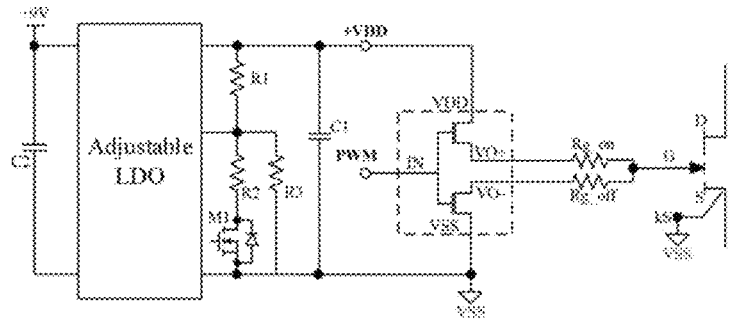
FIG. 11 shows a circuit schematic for an example implementation of burst mode operation with active control on a low drop out regulator with unipolar driving.

FIGS. 10 and 11 show example circuit implementations for active gate voltage control for burst mode operation, responsive to the burst mode control signal from the first logic circuit.

FIG. 10 shows a circuit schematic for active gate voltage control for a GaN HEMT of a first example comprising a gate driver that provides bipolar driving. Active gate voltage control circuitry comprises two Zener diodes in parallel. In this example, the first Zener diode DZ1, series transistor M1 and resistor R1 are configured for clamping the gate voltage $V_{gs(on)}$ at a first operational voltage, e.g. 6V, i.e. to turn-on the GaN transistor for a normal operational mode. The second Zener diode DZ2 is selected to clamp the gate voltage $V_{gs(on)}$ at a second operational voltage, higher than the first operational voltage, e.g. 8V, for burst mode operation. The control signal Ctrl1 from the first logic circuit is used to control the gate of transistor M1.

FIG. 11 shows a circuit schematic for active gate voltage control for a GaN HEMT of a second example comprising a gate driver that provides unipolar driving using an adjustable low drop out (LDO) regulator to provide active control of the gate voltage. In this example, the first control signal Ctrl1 from the first logic circuit is used to control the gate of transistor M1.

Figure 12:
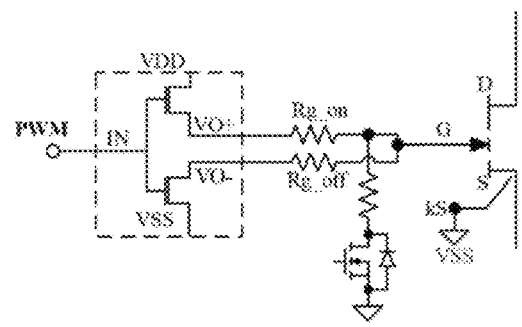
FIG. 12 shows a circuit schematic for an example implementation of protection mode with active control on a voltage divider.

FIG. 12 shows a circuit schematic for active gate voltage control comprising a fast soft turn-off circuit for implementing protection mode for a GaN HEMT comprising active control of the turn-on voltage using a voltage divider, e.g. a series resistor and transistor M2, and diode in parallel with the transistor, for fast soft-turn off. The gate of transistor M2 receives the second control signal from the second logic circuitry.

The circuit schematics shown in FIGS. 10 to 12 are provided by way of example only. It will be apparent to a skilled person that other circuit implementations may be used for the active gate voltage control circuit comprising the first logic circuit for providing a first control signal to the gate driver for increasing/boosting $V_{gs(on)}$ to implement burst mode, and that other circuit implementations may be used for the second logic circuit for providing the second control signal to the gate driver for reducing $V_{gs}$ to implement protection mode, which may comprise single-stage or multi-stage turn-off to implement protection mode. For example, for switching mode power supplies, it may be beneficial to boost $V_{gs(on)}$ during start-up, e.g. from a usual operational value of 6V to 8V during start-up, to temporarily increase the saturation current. Other example applications of active gate voltage control circuit may comprise implementation of burst mode for motor drives and laser drivers for LIDAR when a higher peak current is required.

Figure 13:
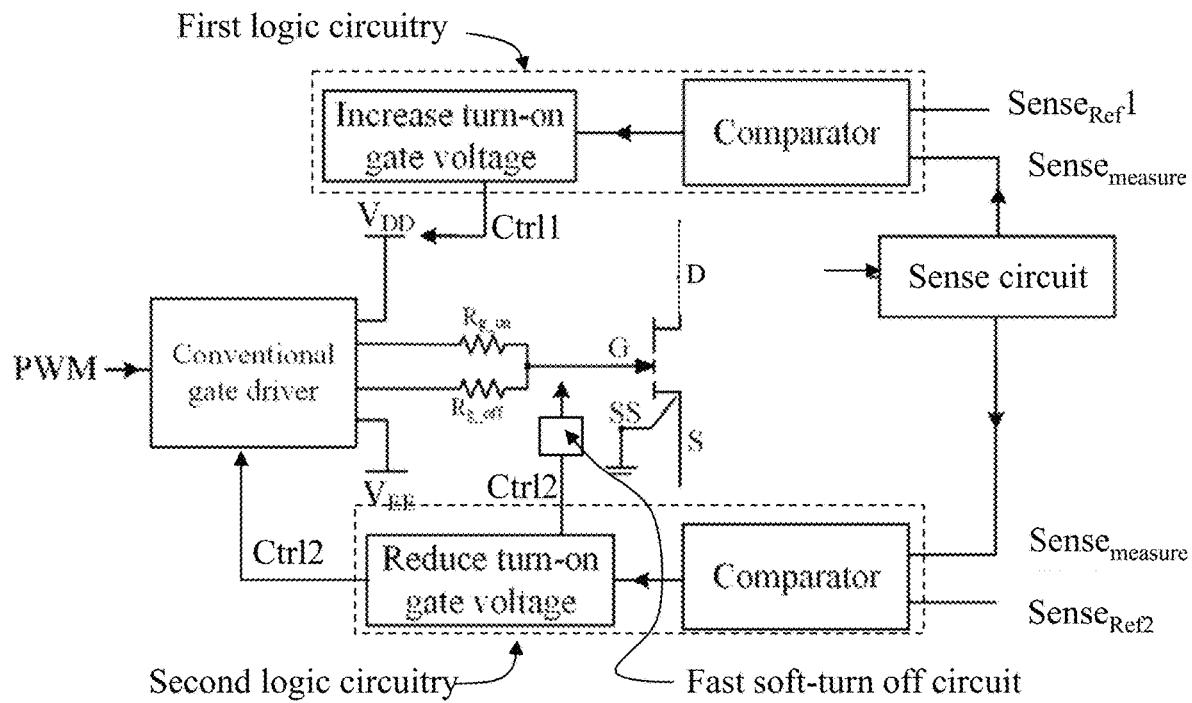
FIG. 13 shows a schematic block diagram for implementation of active gate voltage control for a power switching device, comprising a GaN HEMT, of another example embodiment.

FIG. 13 shows a circuit block diagram of an active gate voltage control circuit for a power switching device of another example embodiment. For example, the power switching device comprises an e-mode GaN HEMT comprising a source, a drain and a gate, and respective source, drain and gate terminals (S, D, G) and a source sense (Kelvin source) terminal (SS). The GaN HEMT may be driven by a conventional gate driver having power input terminals $V_{DD}$ and $V_{EE}$. The gate driver receives a gate drive control signal, i.e. PWM input signal, and outputs an appropriate gate voltage Vgs to turn-on and turn-off the transistor. For example, the power source may be a 0 to 9V power source and, for normal operation of an e-mode GaN HEMT, the gate driver is configured to output a +6V gate voltage $V_{gs(on)}$ to turn-on the transistor and to output a gate voltage $V_{gs(off)}$ below the threshold voltage, e.g. 0V or less, e.g. a negative bias of −3V, to turn-off the transistor. In this example, separate gate resistors $R_{g-on}$ and $R_{g-off}$ are provided to control turn-on and turn-off rates.

The active gate voltage control circuitry shown in FIG. 13 comprises a sense circuit for monitoring an operational parameter $Sense_{measure}$ indicative of an actual, or expected, drain-source current saturation event. The detection circuit may be integrated with the GaN HEMT, e.g. a drain voltage sense circuit as disclosed in U.S. Ser. No. 15/807,021, or the detection circuit may comprise discrete components. The output signal $Sense_{measure}$ is fed to a first logic circuit and a second logic circuit. A first voltage input to the first logic circuit provides a first reference signal $Sense_{ref1}$ for burst mode operation. A second voltage input to the second logic circuit provides a second reference signal $Sense_{ref2}$ for protection mode operation.

In the first logic circuit, logic elements compare $Sense_{measure}$ and the first reference signal $Sense_{ref1}$ and generates a first (burst mode) control signal Ctrl1 when $Sense_{measure}$ is $\geq Sense_{ref1}$. The burst mode control signal Ctrl1 is fed to the gate driver to initiate boost mode operation comprising boosting the turn-on gate voltage $V_{gs(on)}$ when $Sense_{measure}$ is $\geq Sense_{ref1}$. For example, gate driver operates to gradually increase the gate drive voltage $V_{gs(on)}$ from 6V, used for normal operation, to 8V for burst mode operation, over a specified time period, e.g. 5 μs, to allow for a higher saturation current.

In the second logic circuit, logic elements compare $Sense_{measure}$ and the second reference signal $Sense_{ref2}$ and generates a second (protection mode) control signal Ctrl2 when $Sense_{measure}$ is $\geq Sense_{ref2}$. The protection mode control signal Ctrl2 is fed to the gate driver to implement protection mode operation comprising reducing the gate voltage below the threshold voltage to turn-off the power switching device. A multi-stage turn-off may be used to reduce the turn-on gate voltage, in two or more steps, comprising implementing fast soft turn-off before full turn-off of the GaN HEMT. For example, gate voltage control circuitry may comprise an active pull-down circuit comprising a resistor and a transistor, which receives a second control signal Ctrl2 from the second logic circuit. The active pull-down circuit may be connected directly to, or close to, the gate terminal of the GaN HEMT, to implement fast soft switching to reduce the gate voltage $V_{gs}$, with minimal delay, e.g. on a nanosecond timescale. Then the second control voltage 2, which is output to the gate driver, further reduces the gate voltage $V_{gs}$ to below threshold voltage, to fully turn-off the GaN HEMT, e.g. after a delay of tens of nanoseconds The sense circuit may use any control input or sense input which provides an operating parameter indicative of an event such as current saturation, non-standard operating conditions, or a fault. Burst mode operation and/or protection mode operation may be implemented intermediate (during) such an event, in advance of such an event, or in response to such an event. The specific values for $V_{ref1}$ and $V_{ref2}$ for active gate voltage control of example GaN HEMTs referred to herein are provided by way of example only. These example GaN HEMTs are typically operated with $V_{gs(on)}$=6V for normal operation, to provide longer term reliability. While they may be operated with $V_{gs(on)}$=8V and still provide long term reliability, if they are operated for extended periods with higher $V_{gs(on)}$, e.g. with $V_{gs(on)}$ in a range of 10V to 13V early failure would be expected. Active gate voltage control with burst mode operation allows for $V_{gs(on)}$ to be temporarily increased by a few volts above the typical $V_{gs(on)}$ used for normal operation, to increase saturation current temporarily during events such as a surge test, a load transition, grid transition, etc., which may result in overcurrent and short circuit conditions.

Burst mode operation provides for increased robustness of enhancement mode GaN power switching devices. $V_{ref1}$ and $V_{ref2}$ are selected to enable burst mode operation, while ensuring that $V_{gs(on)}$ is maintained in a range up to a few volts greater than the $V_{gs(on)}$, e.g. ~8V, and preferably less than 10V, which allows a temporary increase saturation current without significantly affecting long term reliability. $V_{ref2}$ is selected to implement protection mode to avoid increasing $V_{gs(on)}$ into a range, e.g. >10V which may result in early device failure or reduced long term reliability.

Active gate voltage control may be intentional, manual, or automatic, and used when there is a need, or anticipated need for more current, e.g. by predicting timing and using burst mode for optimizing operating conditions and protection. Active gate voltage control comprising burst mode operation as described herein provides for current pulse management to improve performance for various applications. For example, for a 50 Hz AC input on board charger, it may be desirable to implement burst mode automatically to provide more current at the peak of the 50 Hz sine wave. Thus burst mode operation may be implemented to optimize performance dynamically, not only to react to fault events.

More generally, in other embodiments comprising power switching devices comprising GaN transistors, and for power switching devices comprising transistors implemented using other semiconductor technologies, any suitable type of sense signal input, such as a measured sense signal output $Sense_{measure}$ of a sensing circuit for monitoring, detecting or measuring an on-state operational parameter, together with appropriate reference values of $Sense_{ref1}$ and $Sense_{ref2}$, may be used to implement active gate voltage control comprising at least one of burst mode operation and protection mode operation. For example, any method of overcurrent detection could be used instead of, or in conjunction with, drain-source on-voltage detection. For protection mode comprising automatic shutdown of a GaN power transistor, it is preferable to use Vds(on) detection, for example as described with reference to the active gate voltage control circuit of the first embodiment.

Although embodiments of the invention have been described and illustrated in detail, it is to be clearly understood that the same is by way of illustration and example only and not to be taken by way of limitation, the scope of the present invention being limited only by the appended claims.

The invention claimed is:

1. An active gate voltage control circuit for a power semiconductor transistor comprising:
a sensing circuit for monitoring an on-state operational parameter of the power semiconductor transistor and generating a sense output signal indicative of the on-state operational parameter; and
first logic circuitry configured to compare the sense output signal with a first reference signal (Sense$_{ref1}$) and generating a first control signal to implement burst mode operation when the sense output signal is ≥Sense$_{ref1}$, wherein: burst mode operation comprises outputting the first control signal to a gate driver of the power semiconductor transistor to increase a gate-source voltage to enable an increased saturation current when the sense output signal is ≥Sense$_{ref1}$.

2. The active gate voltage control circuit of claim 1, comprising second logic circuitry configured to compare the sense output signal with a second reference signal (Sense$_{ref2}$) and generate a second control signal for implementing protection mode when the sense output signal is ≥Sense$_{ref2}$, wherein: protection mode operation comprises outputting the second control signal to the gate driver to reduce the gate-source voltage when the sense output signal is ≥Sense$_{ref2}$.

3. The active gate voltage control circuit of claim 2, wherein the first and second reference signals Sense$_{ref1}$ and Sense$_{ref2}$ are selected to maintain the turn-on gate-source voltage in a range that enables the increased saturation current to be implemented temporarily for dynamic performance management.

4. The active gate voltage control circuit of claim 1, comprising second logic circuitry configured to compare the sense output signal with a second reference signal (Sense$_{ref2}$) and generate a second control signal for implementing protection mode when the sense output signal is ≥Sense$_{ref2}$, wherein: protection mode operation comprises outputting the second control signal to the gate driver to reduce the gate-source voltage when the sense output signal is ≥Sense$_{ref2}$ and implement at least one of single-stage turn-off and multi-stage turn-off of the power semiconductor transistor.

5. The active gate voltage control circuit of claim 4, wherein Sense$_{ref1}$ and Sense$_{ref2}$ are selected to maintain the turn-on gate-source voltage in a range that enables the increased saturation current to be implemented temporarily for dynamic performance management without precipitating early device failure.

6. The active gate voltage control circuit of claim 4, wherein the second logic circuitry is configured to implement multi-stage turn-off, by reducing the gate-source voltage of the power transistor to implement fast soft turn-off, followed by a delay before reducing the gate-source voltage to below a gate-source threshold voltage for full turn-off of the gate of the power semiconductor transistor.

7. The active gate voltage control circuit of claim 6, for operation of a power semiconductor switching device comprising an E-mode GaN HEMT, comprising:
wherein the sensing circuit comprises a drain-source voltage sensing circuit for sensing a drain-source on-voltage V$_{ds(on)}$, and the gate driver is configured to provide a first gate-source turn-on voltage V$_{gs(on)}$ for normal operation and a gate-source turn-off voltage V$_{gs(off)}$ of 0V or a negative bias, wherein:
when the drain-source voltage V$_{ds(on)}$ reaches or exceeds a first voltage reference V$_{ref1}$, the gate-source turn-on voltage is increased to a second gate turn-on voltage V$_{gs(on-boost)}$, which is several volts greater than the first gate turn-on voltage, to the implement burst mode operation; and
when the drain source voltage V$_{ds(on)}$ reaches or exceeds a second voltage reference V$_{ref2}$, the gate-source turn-on voltage is first reduced to several volts below the first gate turn-on voltage V$_{gs(on)}$, to implement soft turn-off, and then reduced to the gate-source turn-off voltage, to fully turn-off the gate of the power semiconductor transistor.

8. An active gate voltage control circuit for a power semiconductor transistor comprising:
a gate driver having power supply inputs V$_{DD}$ and V$_{EE}$, an input for receiving a gate drive control signal and an output for outputting a gate-source turn-on voltage (V$_{gs(on)}$) and a gate drive turn-off voltage (V$_{gs(off)}$),
a detection circuit for monitoring a drain-source on-voltage V$_{ds(on)}$ of the power semiconductor transistor and generating an output voltage signal V$_{measure}$ indicative of V$_{ds(on)}$;
a first reference voltage input providing a first reference voltage V$_{ref1}$ for implementing burst mode operation;
a second reference voltage input providing a second reference voltage V$_{ref2}$ for implementing protection mode operation, where V$_{ref2}$ is greater than V$_{ref1}$;
first logic circuitry configured to compare the output signal voltage V$_{measure}$ with the first reference voltage V$_{ref1}$ and generate a first control signal when V$_{measure}$ is ≥V$_{ref1}$, the first control signal being output to the gate driver to implement burst mode operation comprising increasing the turn-on gate voltage when V$_{measure}$ is ≥V$_{ref1}$;
second logic circuitry configured to compare the output signal voltage V$_{measure}$ with the second reference voltage V$_{ref2}$ and generate a second control signal when V$_{measure}$ is ≥V$_{ref2}$; the second control signal being output to the gate driver to implement protection mode operation comprising reducing the turn-on gate-source voltage when V$_{measure}$ is ≥V$_{ref2}$.

9. The active gate voltage control circuit of claim 8, wherein the second logic circuitry is configured to implement multi-stage turn-off, by reducing the gate-source voltage V$_{gs(on)}$ of the power transistor to a soft turn-off voltage V$_{gs(soft\ turn-off)}$ for soft turn-off, followed by a delay before reducing the gate-source voltage to below a threshold voltage for full turn-off of the gate of the power semiconductor transistor.

10. The active gate voltage control circuit of claim 8, wherein the drain voltage sensing circuit is integrated with the power semiconductor transistor and the first and second logic circuits are integrated with the gate driver.

11. The active gate voltage control circuit of claim 8, for operation of a power semiconductor switching device comprising an E-mode GaN HEMT, configured to provide a turn-on gate-source voltage V$_{gs(on)}$ of 6V for normal operation and a turn-off gate-source voltage $V_{gs(off)}$ of 0V or a negative bias, wherein when the drain-source voltage $V_{ds}$ reaches or exceeds $V_{ref1}$, the gate-source turn-on voltage is increased to 8V to implement burst mode and allow for a higher saturation current, and when the drain source voltage $V_{ds}$ reaches or exceeds $V_{ref2}$, the gate turn-on voltage is reduced to 4V, to implement soft turn-off, and then reduced to 0V, or below, to fully turn-off the gate of the power semiconductor transistor.

12. The active gate voltage control circuit of claim 11, wherein the first reference voltage $V_{ref1}$ is 4V and the second reference voltage $V_{ref2}$ is 8V.

13. The active gate voltage control circuit of claim 8, wherein the gate driver provides bipolar driving and a voltage divider arrangement of first and second Zener diodes with active control of a transistor in series with the first Zener diode for providing a first turn-on gate-source voltage $V_{gs(on)}$ for normal operation and the second Zener diode providing a second turn-on gate-source voltage $V_{gs(boost)}$ for burst mode operation.

14. The active gate voltage control circuit of claim 8 wherein the gate driver comprises an adjustable low drop out regulator (LDO) with unipolar driving and the first control signal provides active control on the LDO to adjust the turn-on gate-source voltage $V_{gs(on)}$.

15. The active gate voltage control circuit of claim 8, wherein the gate driver comprises an active pull-down circuit connected directly to the gate output of the gate driver which receives the second control signal.

16. The active gate voltage control circuit of claim 15, wherein the active pull-down circuit comprises an actively controlled voltage divider to reduce $V_{gs(on)}$ on receiving the second control signal.

17. The active gate voltage control circuit of claim 8, wherein the gate driver comprises an actively controlled voltage divider connected close to the gate output of the gate driver for reducing the gate voltage to the soft turn-off value $V_{gs(soft\ turn-off)}$ on receiving the second control signal, and wherein the second control signal is provided to the gate driver to turn-off the gate of the power semiconductor transistor after said delay.

18. An active gate voltage control circuit for a power semiconductor transistor comprising:
a gate driver for outputting a turn-on gate-source voltage $V_{gs(on)}$ and a turn-off gate-source voltage $V_{gs(off)}$ in response to a gate drive control signal,
drain voltage sensing means for sensing a drain-source on-voltage $V_{ds(on)}$ of the power semiconductor transistor and generating a voltage signal $V_{measure}$ indicative of $V_{ds(on)}$;
a first logic means for comparing the output signal voltage $V_{measure}$ with a first reference voltage $V_{ref1}$ and generating a first control signal when $V_{measure}$ is $\geq V_{ref1}$, the first control signal being fed to the gate driver to implement burst mode operation comprising increasing the turn-on gate-source voltage when $V_{measure}$ is $\geq V_{ref1}$ to enable a higher saturation current;
a second logic means for comparing the output signal voltage $V_{measure}$ with a second reference voltage $V_{ref2}$ and generating a second control signal when $V_{measure}$ is $\geq V_{ref2}$; the second control signal being fed to the gate driver to reduce the gate-source voltage when $V_{measure}$ is $\geq V_{ref2}$ to implement protection mode operation comprising reducing the turn-on gate-source voltage.

19. The active gate voltage control circuit of claim 18, wherein protection mode comprises multi-stage turn-off of the power semiconductor transistor, comprising firstly reducing the gate-source voltage a few volts below the turn-on gate-source voltage for normal operation to implement soft turn-off, and then reducing the gate-source voltage below a threshold voltage to fully turn-off the power semiconductor transistor.

20. The active gate voltage control circuit of claim 18, wherein:
the drain voltage sensing means comprises any one of:
a drain-source on-voltage sensing circuit integrated with the power semiconductor transistor;
a drain-source on-voltage sensing circuit integrated with the gate driver;
a drain-source on-voltage sensing circuit comprising discrete components; and
combinations thereof,
and
the first and second logic means comprise any one of:
first and second logic circuits integrated with the power semiconductor transistor;
first and second logic circuits integrated with the gate driver;
first and second logic circuits comprising discrete components; and
combinations thereof.

21. The active gate voltage control circuit of claim 18, wherein the drain voltage sensing means and the first and second logic means comprise discrete components co-packaged with the gate driver and the power semiconductor transistor.

22. The active gate voltage control circuit of claim 18, wherein:
the drain voltage sensing means and the first and second circuit means are integrated with the gate driver; or
the drain voltage sensing means is integrated with the power semiconductor transistor and the first and second circuit means are integrated with the gate driver.

23. A method of actively controlling a gate-source voltage for turn-on and turn-off of a power semiconductor device comprising a GaN power transistor, comprising:
providing a gate-source voltage $V_{gs(on)}$ to turn on the power transistor;
sensing a drain-source on-voltage $V_{ds(on)}$ of the power semiconductor transistor and generating a voltage signal $V_{measure}$ indicative of $V_{ds(on)}$;
in a first logic circuit, comparing the output signal voltage $V_{measure}$ with a first reference voltage $V_{ref1}$ and generating a first control signal when $V_{measure}$ is $\geq V_{ref1}$, and providing the first control signal to a gate driver of the GaN power transistor to implement burst mode operation comprising increasing the turn-on gate-source voltage when $V_{measure}$ is $\geq V_{ref1}$ to enable a higher saturation current;
in a second logic circuit, comparing the output signal voltage $V_{measure}$ with a second reference voltage $V_{ref2}$ and generating a second control signal when $V_{measure}$ is $\geq V_{ref2}$; and providing the second control signal to the gate driver to reduce the gate-source voltage when $V_{measure}$ is $\geq V_{ref2}$ to implement protection mode operation.

* * * * *